United States Patent
Miyakawa et al.

(10) Patent No.: US 7,364,778 B2
(45) Date of Patent: Apr. 29, 2008

(54) CONTAINER FOR AN ELECTRONIC COMPONENT

(75) Inventors: Takeshi Miyakawa, Gunma (JP); Tetsuo Fujimura, Gunma (JP); Katsuhisa Ogita, Gunma (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 330 days.

(21) Appl. No.: 10/178,021

(22) Filed: Jun. 24, 2002

(65) Prior Publication Data

US 2003/0235041 A1    Dec. 25, 2003

(51) Int. Cl.
*B29D 22/00*    (2006.01)
*B29D 23/00*    (2006.01)
*B32B 1/08*    (2006.01)

(52) U.S. Cl. ............... 428/35.7; 257/629; 257/660; 257/687; 257/678; 428/500

(58) Field of Classification Search ............... 428/35.7, 428/35.2, 40.1, 500; 257/629, 660, 659, 257/678, 687, 701, 723, 724
See application file for complete search history.

(56) References Cited

U.S. PATENT DOCUMENTS

| | | | | |
|---|---|---|---|---|
| 3,981,074 A | * | 9/1976 | Yamamoto et al. | 264/272.17 |
| 5,428,100 A | * | 6/1995 | Asai et al. | 524/496 |
| 5,599,621 A | * | 2/1997 | Akhter | 428/349 |
| 6,896,828 B2 | * | 5/2005 | Fox et al. | 252/512 |

FOREIGN PATENT DOCUMENTS

| | | |
|---|---|---|
| JP | 61-217370 | 9/1986 |
| JP | 62-183430 | 8/1987 |
| JP | 5-77931 | 3/1993 |
| JP | 5-94895 | 4/1993 |
| JP | 5-251548 | 9/1993 |
| JP | 5-269946 | 10/1993 |
| JP | 3001281 | 6/1994 |
| JP | 3001281 | 8/1994 |
| JP | 08011932 A * | 1/1996 |
| JP | 10-329279 | 12/1998 |
| JP | 11-1589 | 1/1999 |
| JP | 2001-17371 | 1/2001 |
| JP | 2001-31295 | 2/2001 |

OTHER PUBLICATIONS

U.S. Appl. No. 10/178,021, filed Jun. 24, 2002, Miyakawa et al.
U.S. Appl. No. 10/495,656, filed May 17, 2004, Miyakawa et al.

* cited by examiner

*Primary Examiner*—Michael C. Miggins
(74) *Attorney, Agent, or Firm*—Oblon, Spivak, McClelland, Maier & Neustadt, P.C.

(57) ABSTRACT

A container for an electronic component made of a resin, wherein when the container and an electronic component contained in the container are rubbed 20,000 times, a static electrification voltage of at most 2,000V by the absolute value on the surface of the electronic component is generated.

37 Claims, 2 Drawing Sheets

CONTAINER FOR AN ELECTRONIC COMPONENT

BACKGROUND OF THE INVENTION

1. Field of the Invention

The present invention relates to a container for an electronic component and a sheet for packaging an electronic component.

2. Discussion of Background

As a container for an electronic component such as an IC, a diode, a liquid crystal or a capacitor, a magazine, an embossed carrier tape, a tray, a bag, a container, a form, etc. may be mentioned. They may be produced by injection molding. Otherwise, they may be produced from a sheet by press molding, vacuum forming or pressure forming. Such a container is used for containment, storage or transport of electronic components. Among electronic components, an IC comprises an integrated circuit called chip sealed with e.g. an epoxy resin. The IC is easily electrified with static electricity. Static electricity destroys the integrated circuit in the worst case. The IC is transported in a container in many cases. Such a container has electrical conductivity in general, so as to easily remove static electricity generated by contact or rubbing between the electronic component and the container, and to uniformly disperse the generated charge into the container so that a potential difference is less likely to generate. In order to impart electrical conductivity to the container for an electronic component, a metal material having electrical conductivity or a resin having carbon fibers or carbon black kneaded therewith is used. An electrical conductive coating of e.g. carbon black may be coated on the surface of the container to impart electrical conductivity in some cases. Such a container has electrical conductivity, whereby when static electricity is generated, the static electricity is likely to go away by earthing, and destruction of an IC by static electricity can thereby be prevented. However, impairment due to static electricity can not completely be prevented. As wiring in the electronic component becomes fine along with high integration of the electronic component, the electronic component is more likely to be influenced by static electricity.

Static electricity may cause other problems. The electronic component may be attached to the container by static electricity and it may be difficult to take it out in some cases. When a cover tape as a covering material of a carrier tape is peeled off to take out the electronic component, the electronic component is attached to the cover tape and pop out from the carrier tape in some cases. Such a trouble causes decrease in workability at the time of mounting electronic components.

SUMMARY OF THE INVENTION

A conventional container for an electronic component is made to have electrical conductivity to destaticize static electricity to protect the electrical component from impairment. However, "probability of generation" of static electricity by rubbing with an electronic component such as an IC is not considered at all. Even an electrically conductive container may generate static electricity. Even when the container for an electronic component has electrical conductivity, an IC is electrified with static electricity by rubbing between the IC and the container for an electronic component. The molding compound on the surface of the IC is not electrically conductive, and accordingly the generated charge can not completely be removed even by earthing of the container for an electronic component. According to measurement by the present inventors, it was confirmed that even when an IC is contained in a container for an electronic component having electrical conductivity in an insulated state, when the container is shaken, the static electrification voltage on the surface of the IC exceeds 10,000V or 20,000V in some cases. The static electricity charged on the surface of the IC is sufficient to destroy the IC. The electronic component is contained in an electrically conductive container and transported. The electrical component is shaken in the container, static electricity is generated, the container is not earthed during transport, and the static electrification voltage of the generated static electricity increases.

In order to prevent impairment by static electricity, generation of static electricity itself when the electronic component and the container are rubbed must be inhibited. By inhibition of generation of static electricity itself, the electronic component can be protected from impairment by static electricity. The container for an electronic component must be one which lowers the absolute value of the static electrification voltage on the surface of the electronic component to be generated by rubbing between the container and the electronic component. The absolute value of the static electrification voltage is at most 2,000V, preferably at most 1,000V.

In order to lower the static electrification voltage, the container may be made to have a composition suitable therefor. A material which is less likely to generate static electricity should be used for the part to be in conduct with the electronic component. A resin which is close to a material at the surface of the electronic component in the series of frictional electrification may be used. For example, a container for an electronic component, which contains a graft copolymer comprising a styrene type polymer and/or an acrylic ester type polymer grafted to an olefin type polymer, controls generation of static electricity. It is also effective to roughen the surface of the container. When the surface roughness of the container is such that Ra is at least 0.5 μm and/or Rmax is at least 5 μm as defined in JIS B-0601, the area of contact between the container and the electronic component is decreased, whereby the amount of static electrification generated by slide friction is reduced.

By decreasing generation of static electricity, attachment of the electronic component to the container can be prevented, and static electricity destruction of an electronic component which is sensitive to static electricity can be prevented.

DETAILED DESCRIPTION OF THE PREFERRED EMBODIMENTS

Figure 1:
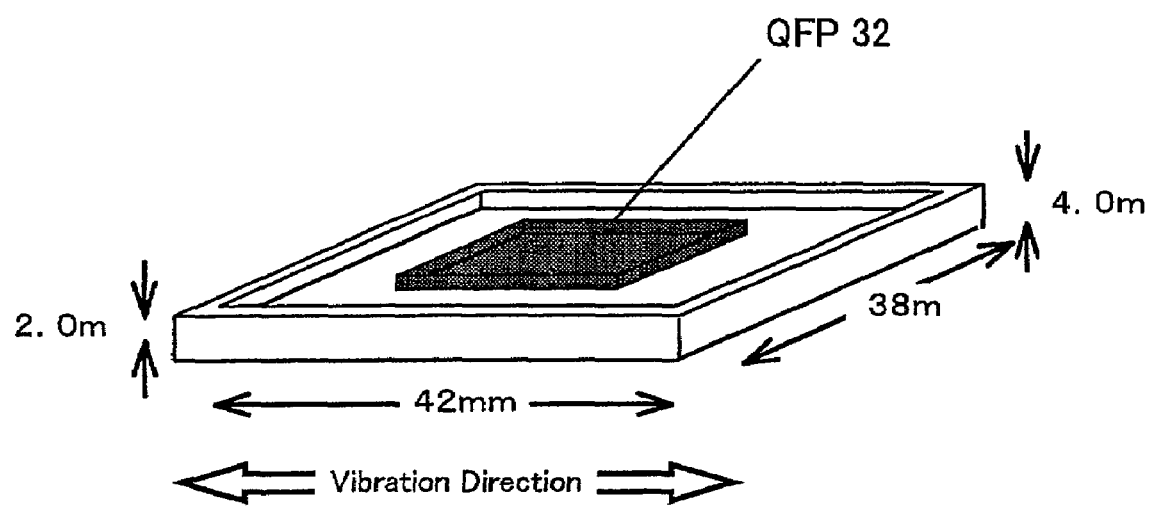
FIG. 1 is a diagram illustrating the shape of a resin container used for a frictional electrification test with an IC.

The container for an electronic component is made of a resin. The resin is preferably such that when the resin is rubbed with an electronic component to be contained, the absolute value of the static electrification voltage is as low as possible. The static electrification voltage is at most 2,000V, preferably at most 1,000V, after rubbing of 20,000 times. A resin which generates a static electrification voltage of 1,000V after rubbing of 500 times is also preferred. The resin may be either a thermoplastic resin or a thermosetting resin so long as the above range is satisfied. A thermoplastic resin is easily molded and preferred.

The resin for the container is preferably one which is close to the resin used in the molding compound for an electronic component to be contained, in the series of frictional electrification. A positive polarity resin and a negative polarity resin in the series of frictional electrification may be used together. Static electricity generated by rubbing between the container and the electronic component can be reduced to decrease the static electrification voltage. An epoxy type resin is widely used for a molding compound for an IC. A blended product of a polystyrene which is on the positive polarity side and a polyethylene on the negative polarity side relative to the epoxy type resin in the series of frictional electrification is a preferred resin. A resin having structures of both polystyrene and polyethylene is also used preferably. Such a resin may, for example, be a copolymer comprising a styrene type polymer and/or an acrylic ester type polymer grafted to an olefin type polymer. The olefin type polymer is one obtained by polymerization of an olefin, and it may, for example, be a homopolymer of an olefin, a copolymer of a plurality of olefins, or a copolymer of an olefin. An ethylene type polymer, a propylene type polymer or an ethylene-glycidyl methacrylate type copolymer may suitably be used. The styrene type polymer is a polymer obtained by polymerization of styrene as the main component, and it may, for example, be a styrene polymer which is a homopolymer of styrene, or a copolymer of styrene. As the copolymer of styrene, an acrylonitrile-styrene copolymer may, for example, be preferably used. The acrylic ester type polymer is a homopolymer of methyl methacrylate or a copolymer of methyl methacrylate with a monomer copolymerizable therewith. The copolymerizable monomer may, for example, be a $C_{2-4}$ methacrylate, a $C_{1-8}$ acrylic ester such as butyl acrylate, styrene, α-methylstyrene, acrylonitrile, acrylic acid or another methylenic unsaturated monomer.

To the graft copolymer, a thermoplastic resin such as a polyethylene type resin, a polystyrene type resin, an acrylic type resin or a polyester type resin may be added.

To the resin to be used for the container for an electronic component, another component may be added. In such a case, an additive which increases the static electrification voltage to be generated on the electronic component by rubbing with the electronic component should be avoided, or the amount should be small. The another component may, for example, be talc, mica or silica, a metal oxide such as alumina, potassium titanate whisker or calcium oxide, or a bulking agent such as calcium carbonate, magnesium carbonate, calcium silicate, glass fibers, glass flakes or glass beads. An electrically conductive material such as metal fibers such as non-carbon fibers, steel fibers, aluminum fibers, brass fibers, copper fibers or stainless fibers, carbon fibers, carbon fibers coated with a metal, carbon black, a graphite powder or glass fibers coated with a metal may also be added. It is possible to impart electrical conductivity to the resin by addition of such a component. The container for an electronic component being electrically conductive makes no problem but is one of preferred embodiments. In such a case, a part to be in conduct with an electronic component alone may have electrical conductivity, or the container for an electronic component may have a structure comprising at least two layers, and the layer not to be in direct contact with the electronic component may have electrical conductivity.

With the container for an electronic component and the resin, a reinforcing material, a foaming agent, a lubricant, an antioxidant, an ultraviolet protecting agent, a coupling agent, a flame retardant, a flame resisting assistant such as antimony trioxide, a heat resisting stabilizer or a coloring agent may be incorporated within the range of not impairing the purpose of the present invention.

The entire container may have a uniform composition. For example, a container such as a tray or a carrier tape obtained by molding a single layer sheet containing a graft copolymer may be mentioned.

The container may be made of materials having different compositions. A multiple layer sheet having a surface layer containing a graft copolymer on the surface to be in contact with the electronic component, such as a multilayer sheet comprising a substrate layer and a surface layer, may be mentioned. The composition of the substrate layer is not limited since the substrate layer is not in contact with the electronic component. A surface layer may be provided on each side of the substrate layer. For the surface layer to be in contact with the electronic component, a resin which is less likely to generate static electricity when contacted with the electronic component may be used and another resin may be used for the other surface layer. One layer or a plurality of layers which reform dynamic properties such as rigidity or strength, cheap layers with a purpose of cost cutting or electrically conductive layers to obtain more stable effect of inhibiting static electricity, may be provided.

It is preferred to laminate an electrically conductive layer having a surface resistivity of from $10^2$ to $10^{12}$ Ω/□ on the surface layer containing a graft copolymer as the main component. The method of imparting electrical conductivity is not particularly limited and a known method may be employed. It may, for example, be a method of dispersing an ionic antistatic agent, a method of dispersing carbon black or an electrically conductive filler such as a metal filler, or a method of dispersing an electrically conductive polymer such as polyaniline, polythiophene or polypyrrole.

To obtain a multilayer container, a multilayer sheet may be formed. To make the sheet have a multilayer structure, a known method such as co-extrusion using a plurality of extruders, extrusion lamination, thermal lamination or dry lamination by means of e.g. an adhesive may be employed.

The method of preparing the container and the sheet is not particularly limited. A known sheet forming method such as injection molding, vacuum forming, pressure forming or press molding, T-die molding by means of an extruder, calendar forming or casting with a solvent, may be employed. In a case of using a plurality of resins, a material mixed by means of e.g. a tumbler or a mazelar as the case requires, may be subjected to fusion kneading extrusion by means of a single axis extruder or a biaxial extruder or fusion kneading by means of a Brabender to obtain a resin, which is formed into a sheet by the above method.

It is possible to reduce static electricity generated when the electronic component and the container are contacted with each other, by roughening the surface of the container to be in contact with the electronic component. Ra as defined in JIS B-0601 is at least 0.5 μm, preferably at least 1 μm, and/or Rmax as defined in JIS B-0601 is at least 5 μm, preferably at least 10 μm. When Ra is at least 0.5 μm or Rmax is at least 5 μm, the area of contact between the electronic component and the container for an electronic component decreases at the time of rubbing, whereby static electrification on the surface of the electronic component can be inhibited.

The method of imparting the predetermined surface roughness to the container for an electronic component is not particularly limited.

For example, in a case where a tray as the container for an electronic component is produced by injection molding, the roughness can be adjusted by adjusting the roughness on the surface of a mold to be used for the injection molding.

In a case where the container is prepared from a sheet, the surface may be roughened by preliminarily adjusting the roughness on the surface of the sheet. The method of adjusting the surface roughness of the sheet is not particularly limited, but a method of using a rubber roll containing sand as a pinch roll of a resin in a molten state extruded at the time of sheet preparation, may be mentioned. A method of using as a pinch roll, a roll having depressions and protrusions formed on the surface by sandblast treatment, a method of using an engraved roll, or a method of reheating a sheet after preparation by in-line or off-line, and pinching it by means of a rubber roll and/or a roll subjected to sandblast treatment or an engraved roll, may also be mentioned.

In order to form depressions and protrusions on the surface of the container for an electronic component, depressions and protrusions may be formed on the surface of a molded container for an electronic component by means of sandblast treatment. In a case of a carrier tape, it may be prepared by plug forming wherein a prepared sheet is heated and sandwiched between molds, on which depressions and protrusions are preliminarily formed by means of e.g. sandblast treatment. In a case where e.g. a tray or a container is prepared by injecting a molten resin into a mold, depressions and protrusions may be preliminarily formed on the mold by means of e.g. sandblast treatment. By increasing the surface roughness of the container for an electronic component, the area of contact between the electronic component and the container for an electronic component can be reduced, whereby the static electrification voltage at the time of rubbing can be suppressed low.

As another method of forming depressions and protrusions on the surface, a coating containing a fine powder of e.g. spherical silica may be coated on the surface of the container sheet for an electronic component after molding by means of e.g. a bar coater to form depressions and protrusions on the surface. It is also possible to blend an antistatic agent with the coating or blending a fine carbon powder or an electrical conductive agent such as polypyrrole, to impart antistatic properties and electrical conductivity simultaneously.

A thermoplastic resin is used for a container, the surface of which is roughened. The thermoplastic resin is not particularly limited, and it may, for example, be polyvinyl chloride, polyethylene, polypropylene, a styrene homopolymer resin, a rubber modified polystyrene type resin, a polyphenylene ether type resin, a polycarbonate type resin or a polyester type resin. Such a resin may be a random copolymer resin, a block copolymer resin or a graft copolymer resin. The thermoplastic resin may be used alone or in combination.

It is preferred to use as the thermoplastic resin, as mentioned above, a resin which is close to a resin used for a molding compound for an electronic component to be contained in the series of frictional electrification. It is also preferred to use a positive polarity resin and a negative polarity resin relative to the resin to be used for a molding compound in the series of frictional electrification, whereby static electricity generated by rubbing between the container and the electronic component can further be decreased, and the static electrification voltage can be lowered.

To the container for packaging an electronic component, an electrical conductivity with a surface resistivity of from $10^2$ to $10^{12}$ $\Omega/\square$ can be imparted. This is effective to remove generated static electricity. The method is not particularly limited, but a method of adding an electronic conduction substance such as metal fibers such as steel fibers, aluminum fibers, brass fibers, copper fibers or stainless fibers, a metal oxide such as an electrically conductive titanium oxide or zinc oxide, carbon fibers, carbon fibers subjected to a metal coating treatment, carbon black, a graphite powder or glass fibers coated with a metal, to a thermoplastic resin within a range of not impairing the surface roughness, or a method of adding a nonionic, cationic, anionic or betaine type surface active agent, or an ion conduction substance such as a permanent antistatic agent of e.g. a polymer polyether type, to a thermoplastic resin, may be mentioned. Otherwise, it is possible to impart electrical conductivity by coating a carbon fine powder on the surface or coating a polymer type electrically conductive material such as polypyrrole. This is similarly applicable to a sheet for packaging an electronic component.

It is possible to coat an antistatic agent on the surface of the container for an electronic component. This is effective to remove generated static electricity. The antistatic agent may, for example, be a common antistatic agent of nonionic, cationic, anionic or betaine type. As the coating method, a known method such as gravure coating, roll coating, dip coating or spraying may be employed. Further, it is possible to conduct a corona discharge treatment on the coated surface of the sheet, or to subject the sheet to a primer treatment by means of another coating agent. This is similarly applicable to a sheet for packaging an electronic component.

Now, the present invention will be described in detail with reference to Examples. However, it should be understood that the present invention is by no means restricted to such specific examples.

EXAMPLE 1

Using 75 parts by weight of a polystyrene (Toyo styrol HI-U2-301U, manufactured by Toyo Styrene, referred to as "HIPS" in Table 1), 25 parts by weight of a high density polyethylene (HF-310, manufactured by Japan Polychem Corporation, referred to as "HDPE" in Table 1), and 30 parts by weight of a graft copolymer comprising a polyethylene as the main chain and a polystyrene as the side chain (VMXAN-50F, manufactured by Mitsubishi Chemical Corporation, referred to as "PE-g-PS" in Table 1) as a compatibilizing agent for the polystyrene and the polyethylene, a plate-like piece as illustrated in FIG. 1 was molded by injection molding.

Using the plate-like piece, the frictional static electrification voltage with an electronic component (IC of QFP32× 32) employing an epoxy resin as a molding compound was measured.

To measure the frictional static electrification voltage, the plate-like piece as illustrated in FIG. 1 was dispose on a rubbing apparatus and destaticized by a destaticizer. On the other hand, with respect to the IC to be rubbed, with a purpose of accurately measuring the static electrification voltage, metal terminals of the IC were cut and covered with an insulating tape so as to prevent charge transfer from the terminals. The IC was destaticized by a destaticizer and then placed on the plate-like piece, and they were rubbed with each other. As conditions of the rubbing, the plate-like piece was rubbed in a vibration direction as shown in FIG. 1 with a slide width of 22 mm with a rubbing rate of 300 back-and-forth motions/min. After the completion of the rubbing, the static electrification voltages at the rubbed portion of the IC, after rubbing of 50 times, 200 times, 500 times and 20,000 times, were measured. The results are shown in Table 1. For the measurement of the static electrification voltage, static electrification voltage measuring apparatus SK-030 and SK-200 manufactured by KEYENCE CORPORATION were used.

EXAMPLES 2 TO 7

The same operation as in Example 1 was carried out except that the composition was changed as identified in Table 1. Here, in Table 1, PE-g-PS is a graft copolymer comprising a polyethylene as the main chain and a polystyrene as the side chain (MODIPER A1100, manufactured by NOF CORPORATION) and AB is acetylene black (manufactured by Denki Kagaku Kogyo Kabushiki Kaisha).

COMPARATIVE EXAMPLE 1

Using a resin composition comprising 100 parts by weight of a polystyrene (Toyo Styrol HI-U2-301U, manufactured by Toyo Styrene) as a resin, the frictional static electrification test was carried out in the same manner as in Example 1 to measure the relation between the adding number and the static electrification voltage. As evident from the results shown in Table 1, the static electrification voltage significantly increased by rubbing.

COMPARATIVE EXAMPLE 2

Using a resin composition comprising 100 parts by weight of a polystyrene (Toyo Styrol HI-U2-301U, manufactured by Toyo Styrene) and 25 parts by weight of carbon black (SEAST 116 manufactured by Tokai Carbon Co., Ltd. as an electrically conductive material added thereto, having an electrical conductivity with a surface resistivity of $10^2$ Ω/□, the frictional static electrification test was carried out in the same manner as in Example 1 to measure the relation between the frictional number and the static electrification voltage. As evident from the results shown in Table 1, the static electrification voltage significantly increased by rubbing even though the resin had electrical conductivity.

COMPARATIVE EXAMPLES 3 TO 5

The same operation as in Example 1 was carried out except that the composition of the resin was changed as identified in Table 1. Here, in Table 1, PVC is a vinyl chloride resin, A-PET is a polyethylene terephthalate resin, and PC is a polycarbonate resin.

EXAMPLE 8

Using as a graft copolymer a polyethylene-g-polystyrene resin (which means that a polystyrene is grafted to a polyethylene, the same applies hereinafter, MODIPER A-1100, manufactured by NOF CORPORATION), a sheet having a thickness of 0.5 mm was obtained by using a Φ65 mm extruder. From the obtained sheet, a container as shown in FIG. 1 was obtained by vacuum forming.

EXAMPLE 9

Using a polypropylene-g-polystyrene resin (MODIPER A-3100, manufactured by NOF CORPORATION) and an electrically conductive resin composition having 29 wt % of carbon black (DENKA BLACK particulate, manufactured by Denki Kagaku Kogyo Kabushiki Kaisha) kneaded with a polystyrene resin (Toyo Styrol HI-U2-301U, manufactured by Toyo Styrene), a sheet having a polypropylene-g-polystyrene resin layer in a thickness of 200 μm and an electrically conductive resin composition layer in a thickness of 100 μm, and having a total thickness of 300 μm, was obtained by means of a feed block method using a Φ40 mm extruder and Φ65 mm extruder. From the sheet, a container was obtained in the same manner as in Example 8 so that the polypropylene-g-polystyrene resin layer faced inside.

EXAMPLE 10

The same operation as in Example 1 was carried out except that MODIPER A-4200 was used as an ethylene-glycidyl methacrylate copolymer-g-methyl methacrylate resin.

COMPARATIVE EXAMPLE 6

Using as a resin, a resin composition comprising 100 parts by weight of a polystyrene (Toyo Styrol HI-U2-301U, manufactured by Toyo Styrene), the frictional static electrification test was carried out in the same manner as in Example 8 to measure the relation between the rubbing

TABLE 1

| | Ex. 1 | Ex. 2 | Ex. 3 | Ex. 4 | Ex. 5 | Ex. 6 | Ex. 7 | Comp. Ex. 1 | Comp. Ex. 2 | Comp. Ex. 3 | Comp. Ex. 4 | Comp. Ex. 5 |
|---|---|---|---|---|---|---|---|---|---|---|---|---|
| Composition | | | | | | | | | | | | |
| HIPS | 75 | 100 | 25 | 75 | 0 | 0 | 60 | 100 | 100 | 0 | 0 | 0 |
| HDPE | 25 | 0 | 75 | 25 | 0 | 0 | 40 | | 0 | 0 | 0 | 0 |
| PS-g-PE | 30 | 0 | 0 | 0 | 100 | 0 | 0 | 0 | 0 | 0 | 0 | 0 |
| PE-g-PS | 0 | 30 | 30 | 30 | 0 | 100 | 0 | 0 | 0 | 0 | 0 | 0 |
| PVC | 0 | 0 | 0 | 0 | 0 | 0 | 0 | 0 | 0 | 100 | 0 | 0 |
| A-PET | 0 | 0 | 0 | 0 | 0 | 0 | 0 | 0 | 0 | 0 | 100 | 0 |
| PC | 0 | 0 | 0 | 0 | 0 | 0 | 0 | 0 | 0 | 0 | 0 | 100 |
| AB | 0 | 0 | 0 | 25 | 0 | 0 | 0 | 0 | 0 | 0 | 0 | 0 |
| CB | 0 | 0 | 0 | 0 | 0 | 0 | 0 | 0 | 25 | 0 | 0 | 0 |
| Static electrification voltage (V) Rubbing number | | | | | | | | | | | | |
| 50 times | −280 | −180 | −300 | 250 | −160 | −50 | 380 | −930 | −4600 | 5200 | −3960 | −3010 |
| 200 times | −340 | −250 | −450 | 620 | −290 | −120 | 540 | −2600 | −6100 | 7010 | −7620 | −2800 |
| 500 times | −110 | −440 | −550 | 910 | −400 | −330 | 500 | −3500 | −10500 | 7570 | −9010 | −6100 |
| 20,000 times | −350 | −590 | −600 | 880 | −380 | −350 | 520 | −6300 | −16000 | 7040 | −8200 | −8900 | number and the static electrification voltage. As evident from the results shown in Table 2, the static electrification voltage significantly increased by rubbing.

COMPARATIVE EXAMPLE 7

Using as a resin, a resin composition comprising 20 parts by weight of carbon black (acetylene black particulate, manufactured by Denki Kagaku Kogyo Kabushiki Kaisha) as an electrically conductive filler added to 100 parts by weight of a polystyrene (Toyo Styrol HI-U2-301U, manufactured by Toyo Styrene) and having an electrical conductivity with a surface resistivity of $10^4$ $\Omega/\square$, the frictional static electrification test was carried out in the same manner as in Example 8 to measure the relation between the frictional number and the static electrification voltage. As evident from the results shown in Table 2, the static electrification voltage significantly increased by rubbing even though the resin composition had electrical conductivity.

TABLE 2

| | Rubbing number | | | |
|---|---|---|---|---|
| | 50 times | 200 times | 500 times | 20,000 times |
| Ex. 8 | 930 V | 1250 V | 1480 V | 1650 V |
| Ex. 9 | 600 V | 1070 V | 1330 V | 1470 V |
| Ex. 10 | 960 V | 1300 V | 1540 V | 1810 V |
| Comp. Ex. 6 | 870 V | 2470 V | 4100 V | 6900 V |
| Comp. Ex. 7 | −4000 V | −6500 V | −11000 V | −14700 V |

EXAMPLES 11 TO 16

Figure 2:
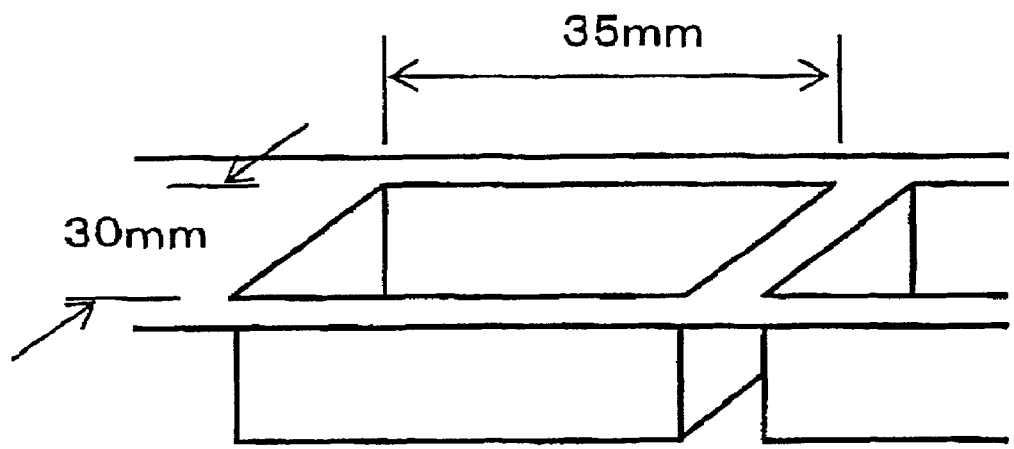
FIG. 2 is a diagram illustrating the shape of a carrier tape used for a frictional electrification test with an IC.

Using as a resin, a polyethylene type graft copolymer resin (MODIPER, trade name, manufactured by NOF corporation) as a material, the resin was extruded from a dice having a width of 550 mm by means of a Φ40 mm single axis extruder manufactured by Tanabe Kikai, and pinched between a metal roll subjected to sandblast treatment and a silicon rubber roll to form a sheet having a thickness of 300 μm. At the time of sheet formation, the roughness of the sandblast was changed to prepare sheets having various surface roughnesses of Examples 11 to 16. Then, each of these sheets was cut, heated and subjected to vacuum forming to form a carrier tape as shown in FIG. 2. As the surface roughness of this carrier tape, Ra and Rmax were measured by using a feeler type surface roughness measuring apparatus SURFCOM manufactured by TOKYO SEIMITSU CO., LTD. with a reference length of 2.5 mm.

The carrier tape was bonded to a metal plate and sprayed with an ionized air for destaticization, then an IC (MQFP27× 27) destaticized by ionized air as an electronic component was put in a pocket of the carrier tape, and the electronic component and the carrier tape were rubbed with each other with a rate of 300 back-and-forth motions per minute for 500 back-and-forth motions. At the time of rubbing, leads of the IC were cut and covered with an insulating tape so that the voltage generated in the package was accurately measured. Then, the IC was taken up with tweezers made of an insulating polyacetal, and the frictional static electrification voltage generated at the rubbed surface was measured. As evident from the results shown in Table 3, substantially no increase in the static electrification voltage was observed by rubbing between the rubbing test specimen having a surface roughness and the IC. Here, for measurement of the static electrification voltage, static electrification voltage measuring apparatus SK-030 and SK-200, manufactured by KEYENCE CORPORATION were used.

EXAMPLE 17

Using as a resin a polystyrene type resin (CLEAREN, trade name, manufactured by Denki Kagaku Kogyo Kabushiki Kaisha), a carrier tape was prepared in the same manner as in Example 11, and the surface roughness and the frictional static electrification amount were evaluated in the same manner as in Example 11. As evident from the results shown in Table 3, substantially no increase in the static electrification voltage was observed by rubbing between the rubbing test specimen made of CLEAREN and the IC.

EXAMPLE 18

Figure 3:
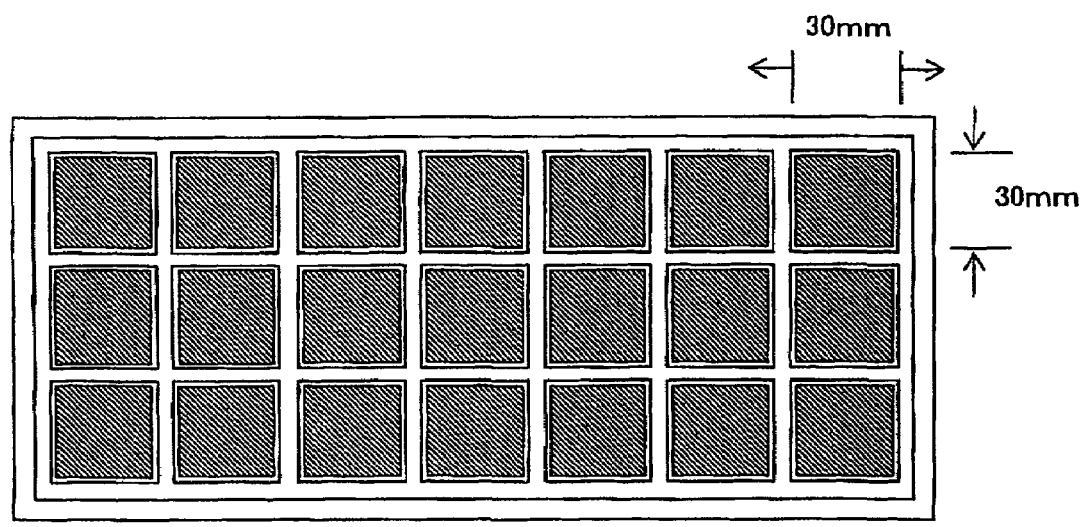
FIG. 3 is a diagram illustrating the shape of an IC tray used for a frictional electrification test with an IC.

Using as a resin a polystyrene homopolymer (Toyo Styrol GP-1, manufactured by Toyo Styrene), a tray-like product as shown in FIG. 3 was formed by means of a 220t injection molder manufactured by TOSHIBA CORPORATION. At that time, the surface roughness of the surface of the mold was increased by sandblast treatment. Using said molded product, the frictional static electrification amount by rubbing with an IC was measured in the same manner as in Example 11.

As evident from the results shown in Table 3, substantially no increase in the static electrification voltage was observed on the surface of the rubbed IC.

TABLE 3

| | Test specimen | Ra | Rmax | Static electrification voltage (kv) |
|---|---|---|---|---|
| Ex. 11 | PE type graft resin | 0.8 | 6.7 | 0.8 |
| EX. 12 | PE type graft resin | 1.2 | 9.9 | 0.8 |
| Ex. 13 | PE type graft resin | 1.8 | 24.5 | 0.3 |
| Ex. 14 | PE type graft resin | 2.0 | 15.4 | −1.1 |
| Ex. 15 | PE type graft resin | 4.9 | 52.7 | 1.3 |
| Ex. 16 | PE type graft resin | 5.0 | 42.4 | 1.1 |
| Ex. 17 | PS resin | 1.1 | 7.7 | 0.0 |
| Ex. 18 | PS resin | 8.2 | 79.2 | 0.2 |

COMPARATIVE EXAMPLES 8 TO 10

For a comparison with Examples 11 to 16, using as a resin a polyethylene type graft copolymer resin (MODIPER, trade name, manufactured by NOF CORPORATION) as the material, the resin was extruded from a dice having a width of 550 mm by means of a Φ40 mm single axis extruder manufactured by Tanabe Kikai, and pinched between a metal gloss roll and a silicon rubber roll to form a sheet having a thickness of 300 μm. At the time of sheet formation, the roll temperature was changed to prepare sheets having surface roughnesses of Comparative Examples 8 to 10. Then, each of these sheets was heated and subjected to vacuum forming to form a carrier tape-like product as shown in FIG. 2. Then, as the surface roughness of the carrier tape, Ra and Rmax were measured by means of a feeler type surface roughness measuring apparatus SURFCOM manufactured by TOKYO SEIMITSU CO., LTD. with a reference length of 2.5 mm, whereupon Ra was less than 0.5 μm and Rmax was less than 5 μm. Then, the IC and the carrier tape were rubbed with each other in the same manner as in Example 11. As evident from the results shown in Table 4, a static electrification voltage of several thousands volt was observed on the surface of the rubbed IC by rubbing between the rubbing test specimen having a surface roughness and the IC.

COMPARATIVE EXAMPLE 11

For a comparison with Example 17, using a polystyrene type resin (CLEAREN, trade name, manufactured by Denki Kagaku Kogyo Kabushiki Kaisha) as a material, a sheet having a thickness of 300 μm was formed in the same manner as in Comparative Example 8 and a carrier tape-like product was prepared. Then, the rubbing test with an IC was carried out in the same manner as in Example 11. As evident from the results shown in Table 4, a static electrification voltage of several thousands volt was observed on the surface of the rubbed IC by rubbing between the rubbing test specimen having a surface roughness and the IC.

COMPARATIVE EXAMPLE 12

For a comparison with Example 18, using as a resin a styrene homopolymer (Toyo Styrol GP-1, trade name, manufactured by Toyo Styrene), a tray-like product as shown in FIG. 3 was formed by means of a 220t injection molder manufactured by TOSHIBA CORPORATION. At that time, the surface of the mold was smoothened to decrease the surface roughness. Using the molded product, measurement of the frictional static electrification amount by rubbing with an IC was carried out in the same manner as in Example 11. As evident from the results shown in Table 4, a static electrification voltage of several thousands volt was observed on the surface of the rubbed IC.

COMPARATIVE EXAMPLE 13

25 parts by weight of carbon black (DENKA ACETYLENE BLACK, trade name, manufactured by Denki Kagaku Kogyo Kabushiki Kaisha) was added to 100 parts by weight of a rubber-modified polystyrene (Toyo Styrol HI-U2-301U, trade name, manufactured by Toyo Styrene) as a resin, followed by mixing by a tumbler, then melt kneading was carried out by means of a biaxial extruder PCM-45 manufactured by IKEGAI CORPORATION to prepare an electrically conductive compound. The electrically conductive compound was extruded by a subextruder (Φ40 mm single axis extruder manufactured by Tanabe Kikai), on the other hand, a rubber-modified polystyrene (Toyo Styrol HI-U2-301U, manufactured by Toyo Styrene) and a styrene-butadiene copolymer resin (TR-2000, trade name, manufactured by JSR) in a weight ratio of 100:5 were mixed and extruded from a main extruder (Φ40 mm single axis extruder), and a three-layer sheet having a thickness of 300 μm, comprising the electrically conductive compound as both surface layers and a non-electrically conductive rubber-modified polystyrene resin as the center layer, was prepared by means of a feed block method. At that time, using a metal gloss roll and a silicon rubber roll as pinch rolls to obtain a three layer sheet having a small surface roughness. The surface resistivity of the sheet was measured by means of Loresta HP manufactured by Mitsubishi Chemical Corporation, whereupon it was $10^5$ Ω/□. Then, this sheet was heated and subjected to vacuum forming to form a carrier tape-like product as illustrated in FIG. 2. Then, a rubbing test with an IC was carried out in the same manner as in Example 11. As evident from the results shown in Table 4, a static electrification voltage of several thousands volt was observed on the surface of the rubbed IC by rubbing between the rubbing test specimen having a surface roughness and the IC.

TABLE 4

| Test specimen | | Ra | Rmax | Static electrification voltage (kv) |
|---|---|---|---|---|
| Comp. Ex. 8 | PE type graft resin | 0.25 | 3.2 | 8.0 |
| Comp. Ex. 9 | PE type graft resin | 0.26 | 2.2 | 8.7 |
| Comp. Ex. 10 | PE type graft resin | 0.30 | 3.0 | 8.2 |
| Comp. Ex. 11 | PS resin | 0.30 | 2.7 | 9.7 |
| Comp. Ex. 12 | PS resin | 0.11 | 1.2 | 7.6 |
| Comp Ex. 13 | PS type three-layer sheet | 0.31 | 2.3 | 3.9 |

What is claimed is:

1. A packaging for an electronic component made of a resin, said packaging comprising:
   a body having an upper surface with an electronic component receiving area configured to receive the electronic component in a non-fixed relationship,
   wherein said upper surface at said electronic component receiving area has a surface roughness Ra of at least 1 μm,
   wherein said upper surface at said electronic component receiving area is composed of a blended product that includes a polystyrene resin and an olefin polymer, and
   wherein said polystyrene resin is configured to have a positive polarity relative to resin of the electronic component and said olefin polymer is configured to have a negative polarity relative to the resin of the electronic component during frictional electrification between said upper surface at said electronic component receiving area and the resin of the electronic component.

2. The packaging according to claim 1, wherein said body is in a form of a sheet.

3. The packaging according to claim 1, wherein said body is in a form of a container.

4. The packaging according to claim 1, wherein said body is in a form of a carrier tape.

5. The packaging according to claim 1, wherein said body is in a form of a tray and wherein said upper surface has a plurality of electronic component receiving areas within respective recesses.

6. The packaging according to claim 1, wherein said body is composed of material having a uniform composition throughout an entirety thereof.

7. The packaging according to claim 1, wherein said body is a multilayered structure with different compositions of materials in different layers of said multilayered structure.

8. The packaging according to claim 1, wherein said upper surface at said electronic component receiving area has a coating of antistatic agent thereon.

9. The packaging according to claim 1, wherein said upper surface at said electronic component receiving area has an Rmax of at least 5 µm.

10. The packaging according to claim 1, wherein said upper surface at said electronic component receiving area has an Rmax of at least 10 µm.

11. The packaging according to claim 1, wherein said upper surface at said electronic component receiving area is configured such that when said upper surface at said electronic component receiving area is rubbed with the electronic component 20,000 times, then an absolute value of a static electrification voltage is generated on the electronic component of at most 2,000 V.

12. The packaging according to claim 1, wherein said upper surface at said electronic component receiving area is configured such that when said upper surface at said electronic component receiving area is rubbed with the electronic component 500 times, then an absolute value of a static electrification voltage is generated on the electronic component of at most 1,000 V.

13. The packaging according to claim 1, wherein said blended product contains a graft copolymer including a styrene type polymer.

14. The packaging according to claim 13, wherein said styrene type polymer is a styrene polymer and/or an acrylonitrile-styrene copolymer.

15. The packaging according to claim 13, wherein said graft copolymer further includes an acrylic ester polymer grafted to said olefin polymer.

16. The packaging according to claim 15, wherein said olefin polymer is at least one member selected from the group consisting of an ethylene polymer, a propylene polymer and an ethylene-glycidyl methacrylate copolymer, and wherein said styrene polymer is a styrene polymer and/or an acrylonitrile-styrene copolymer.

17. The packaging according to claim 1, wherein said blended product contains a graft copolymer including an acrylic ester polymer grafted to said olefin polymer.

18. The packaging according to claim 17, wherein said olefin polymer is at least one member selected from the group consisting of an ethylene polymer, a propylene polymer and an ethylene-glycidyl methacrylate copolymer.

19. A packaged unit comprising:
an electronic component made of a resin; and
a packaging including a body having an upper surface with an electronic component receiving area receiving said electronic component in a non-fixed relationship,
wherein said upper surface at said electronic component receiving area has a surface roughness Ra of at least 1 µm,
wherein said upper surface at said electronic component receiving area is composed of a blended product that includes a polystyrene resin and an olefin polymer, and
wherein said polystyrene resin is configured to have a positive polarity relative to said resin of said electronic component and said olefin polymer is configured to have a negative polarity relative to said resin of said electronic component during frictional electrification between said upper surface at said electronic component receiving area and said resin of said electronic component.

20. The packaged unit according to claim 19, wherein said electronic component is an integrated circuit sealed with a molding compound made of an epoxy resin.

21. The packaged unit according to claim 19, wherein said body is in a form of a sheet.

22. The packaged unit according to claim 19, wherein said body is in a form of a container.

23. The packaged unit according to claim 19, wherein said body is in a form of a carrier tape.

24. The packaged unit according to claim 19, wherein said body is in a form of a tray and wherein said upper surface has a plurality of electronic component receiving areas within respective recesses.

25. The packaged unit according to claim 19, wherein said body is composed of material having a uniform composition throughout an entirety thereof.

26. The packaged unit according to claim 19, wherein said body is a multilayered structure with different compositions of materials in different layers of said multilayered structure.

27. The packaged unit according to claim 19, wherein said upper surface at said electronic component receiving area has a coating of antistatic agent thereon.

28. The packaged unit according to claim 19, wherein said upper surface at said electronic component receiving area has an Rmax of at least 5 µm.

29. The packaged unit according to claim 19, wherein said upper surface at said electronic component receiving area has an Rmax of at least 10 µm.

30. The packaged unit according to claim 19, wherein said upper surface at said electronic component receiving area is configured such that when said upper surface at said electronic component receiving area is rubbed with said electronic component 20,000 times, then an absolute value of a static electrification voltage is generated on said electronic component of at most 2,000 V.

31. The packaged unit according to claim 19, wherein said upper surface at said electronic component receiving area is configured such that when said upper surface at said electronic component receiving area is rubbed with said electronic component 500 times, then an absolute value of a static electrification voltage is generated on said electronic component of at most 1,000 V.

32. The packaged unit according to claim 19, wherein said blended product contains a graft copolymer including a styrene type polymer.

33. The packaged unit according to claim 32, wherein said styrene polymer is a styrene polymer and/or an acrylonitrile-styrene copolymer.

34. The packaged unit according to claim 32, wherein said graft copolymer further includes an acrylic ester polymer grafted to said olefin polymer.

35. The packaged unit according to claim 34, wherein said olefin polymer is at least one member selected from the group consisting of an ethylene polymer, a propylene polymer and an ethylene-glycidyl methacrylate copolymer, and wherein said styrene polymer is a styrene polymer and/or an acrylonitrile-styrene copolymer.

36. The packaged unit according to claim 19, wherein said blended product contains a graft copolymer including an acrylic ester polymer grafted to said olefin polymer.

37. The packaged unit according to claim 36, wherein said olefin polymer is at least one member selected from the group consisting of an ethylene polymer, a propylene polymer and an ethylene-glycidyl methacrylate copolymer.

* * * * *